United States Patent
Tanaka et al.

(10) Patent No.: US 7,085,157 B2
(45) Date of Patent: Aug. 1, 2006

(54) NONVOLATILE MEMORY DEVICE AND SEMICONDUCTOR DEVICE

(75) Inventors: Toshihiro Tanaka, Akiruno (JP); Takashi Yamaki, Kodaira (JP); Yutaka Shinagawa, Iruma (JP); Daisuke Okada, Kunitachi (JP); Digh Hisamoto, Kokubunji (JP); Kan Yasui, Kodaira (JP); Tetsuya Ishimaru, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 182 days.

(21) Appl. No.: 10/805,365

(22) Filed: Mar. 22, 2004

(65) Prior Publication Data

US 2004/0196695 A1    Oct. 7, 2004

(30) Foreign Application Priority Data

Apr. 4, 2003 (JP) ............................. 2003-101124
Feb. 23, 2004 (JP) ............................. 2004-046699

(51) Int. Cl.
*G11C 11/34* (2006.01)
*G11C 16/04* (2006.01)

(52) U.S. Cl. .......................... 365/185.02; 365/185.18; 365/189.09

(58) Field of Classification Search ........... 365/185.01, 365/185.02 O, 185.05, 185.18 X, 189.01, 365/189.09 X
See application file for complete search history.

(56) References Cited

U.S. PATENT DOCUMENTS

| | | | | |
|---|---|---|---|---|
| 5,818,761 A | * | 10/1998 | Onakado et al. | 365/185.18 |
| 5,852,578 A | * | 12/1998 | Hoang | 365/185.28 |
| 6,038,172 A | * | 3/2000 | Rai et al. | 365/185.2 |
| 6,388,293 B1 | | 5/2002 | Ogura et al. | 257/365 |
| 6,567,315 B1 | | 5/2003 | Takase et al. | 365/185.28 |
| 6,643,193 B1 | * | 11/2003 | Yamaki et al. | 365/189.09 |
| 2003/0035329 A1 | * | 2/2003 | Tailliet et al. | 365/200 |

FOREIGN PATENT DOCUMENTS

| | | |
|---|---|---|
| JP | 2001-148434 | 5/2001 |
| JP | 2002-197876 | 7/2002 |

* cited by examiner

*Primary Examiner*—VanThu Nguyen
(74) *Attorney, Agent, or Firm*—Miles & Stockbridge P.C.

(57) ABSTRACT

A method for speeding up data writing and reducing power consumption by reducing the variation of the threshold voltage of each of non-volatile memory cells at data writing. When writing data in a memory cell, a voltage of about 8V is applied to the memory gate line, a voltage of about 5V is applied to the source line, a voltage of about 1.5V is applied to the selected gate line respectively. At that time, in the writing circuit, the writing pulse is 0, the writing latch output a High signal, and a NAND-circuit outputs a Low signal. And, a constant current of about 1 iA flows in a constant current source transistor and the bit line is discharged by a constant current of about 1 iA to flow a current in the memory cell.

18 Claims, 11 Drawing Sheets

NONVOLATILE MEMORY DEVICE AND SEMICONDUCTOR DEVICE

CROSS-REFERENCE TO RELATED APPLICATION

The present invention claims priority from Japanese Patent application JP 2003-101124 filed on Apr. 4, 2003, the content of which is hereby incorporated by reference into this application.

BACKGROUND OF THE INVENTION

The present invention relates to a data writing technique employed for non-volatile memories, more particularly to a technique to be applied effectively to a method for reducing the variation of writing characteristics of MONOS (Metal Oxide Nitride Oxide Semiconductor) memory cells.

A flash memory that uses floating gate memory cells is widely known as a non-volatile memory in which data can be rewritten electrically. So far, there have been proposed various types of MONOS type memory cells to meet such requirements in the market as power saving and faster data writing.

For example, there is a MONOS memory cell in which a voltage (ex., about 0.77V) slightly higher than the threshold voltage of the word gate (control gate) is applied to the object word line so as to limit the data writing current to about 10 iA (refer to the patent document 1). In other words, the data writing current is controlled by the voltage of the word gate. In that connection, the bit line voltage at data writing is fixed at about 0V.

There is also a floating gate type memory cell, which suppresses variation of writing characteristics (refer to the patent document 2).

In this case, a local bit line is connected to the two diffusion layers of the AG-AND (Assist Gate AND) type memory cell respectively and a switch is provided at the connection between the local bit line and a global bit line and between the local bit line and a common source line respectively.

At data writing, a voltage of about 4V is charged to the parasitic capacity of the memory gate side local bit line from the global bit line, and the global bit line is disconnected from the memory gate side local bit line by the switch.

After that, the assist gate side local bit line is connected to the common source line to transfer the charges stored in the memory gate side local bit line to the memory cell, thereby causing SSI (Source Side channel hot electron Injection) to occur so as to write data in the object one-bit memory cell.

Consequently, even when the threshold voltage of the assist gate MOS transistor is varied, the charges used to write data comes to be fixed. The variation of data writing characteristics is thus suppressed.

[Patent Document 1] Official Gazette of Japanese Unexamined Patent Publication No. 2001-148434

[Patent Document 2] Official Gazette of Japanese Unexamined Patent Publication No. 2002-197876

SUMMARY OF THE INVENTION

However, the inventors of the present invention have found that the following problems occur from the conventional data writing technique that uses a non-volatile memory as described above.

When a voltage of a word gate (hereinafter, to be referred to as a selector gate) is controlled to control a data writing current of a MONOS type memory cell, the voltage becomes close to the threshold voltage of the selector gate MOS transistor.

Consequently, the writing current comes to depend on the threshold voltage of the selector gate MOS transistor. The selector gate MOS transistor is part of a memory cell, so that the gate length Lg is almost the minimum length and the variation of the threshold voltage with respect to the variation of manufacturing is large. As a result, the variation of the writing current of each memory cell in the subject memory mat becomes large, resulting in occurrence of a variation of the threshold voltage of the memory gate at data writing. This has been one of the conventional problems.

Furthermore, when an attempt is made to suppress the variation of the writing characteristics of a floating gate type memory cell, the local bit line can be disconnected from the global bit line and the local source line can be disconnected from the common source line with use of a switch respectively.

Furthermore, because there are comparatively many memory cells connected to both local bit line and local source line, the wiring capacity of both local bit line and local source line is comparatively large, thereby one bit memory cell can use comparatively much electrical charges stored in the local bit line. And, the amount of electrical charges is almost fixed, so that the variation of the writing characteristics can be suppressed.

When the subject memory is small in size, however, it should be avoided to provide a switch to any local source line connected to the memory gate side diffusion layer region (source terminal) of each memory cell. This is because the overhead increases, thereby the layout area also increases. Therefore, the local source line comes to be connected to the common source line directly without providing any switch to the local source line.

Consequently, the parasitic capacity of the common source line comes to be connected to many memory cells, so that the electrical charges stored in the wiring parasitic capacity due to written data are not always distributed equally to memory cells. Therefore, it comes to be difficult to suppress the variation of the writing characteristics.

Under such circumstances, it is an object of the present invention to provide a non-volatile semiconductor memory device and a semiconductor integrated circuit device capable of reducing the variation of the threshold voltage of each non-volatile memory cell significantly at data writing, thereby realizing fast data writing and low power consumption in the memory device.

The above and further objects, as well as novel features of the present invention will more fully appear from the following detailed description and the accompanying drawings.

At first, the typical objects of the present invention to be disclosed in this specification will be described briefly as follows.

(1) The non-volatile semiconductor memory device of the present invention in one aspect includes any one of a current supply control transistor disposed between a voltage source and a non-volatile memory cell and connected serially to the voltage source and the non-volatile memory cell, and a current absorption control transistor disposed between a non-volatile memory cell and a reference potential and connected serially to the non-volatile memory cell and the reference potential. The current supply control transistor or current absorption control transistor is operated in a current saturation area denoted by the current-voltage characteristics, thereby controlling a current that flows in the non-volatile memory cell at data writing.

(2) The non-volatile semiconductor memory device of the present invention in another aspect includes: a current supply control transistor disposed between a voltage source and a non-volatile memory cell and connected serially to the voltage source and the non-volatile memory cell; and a current absorption control transistor disposed between the non-volatile memory cell and a reference potential and connected serially to the non-volatile memory cell and the reference potential. The current supply control transistor and the current absorption control transistor are operated in a current saturation area denoted by the current-voltage characteristics, thereby controlling a current that flows in the non-volatile memory cell at data writing.

Other objects of the present invention will be described briefly as follows.

(3) The semiconductor integrated circuit device of the present invention in one aspect includes a non-volatile memory part and a central processing unit (CPU) and the CPU can execute a predetermined processing and instruct the non-volatile memory part to make an operation. The non-volatile memory part includes a plurality of non-volatile memory cells for storing information. The non-volatile memory part includes any one of a current supply control transistor disposed between a voltage source and a non-volatile memory cell and connected serially to the voltage source and the non-volatile memory cell, and a current absorption control transistor disposed between the non-volatile memory cell and a reference potential and connected serially to the non-volatile memory cell and the reference potential. The current supply control transistor or current absorption control transistor is operated in a current saturation area denoted by the current-voltage characteristics, thereby controlling a current that flows in the non-volatile memory cell at data writing.

(4) The semiconductor integrated circuit device of the present invention in another aspect includes a non-volatile memory part and a central processing unit (CPU) and the CPU can execute a predetermined processing and instruct the non-volatile memory part to make an operation. The non-volatile memory part includes a plurality of non-volatile memory cells for storing information. The non-volatile memory part includes a current supply control transistor disposed between a voltage source and a non-volatile memory cell and connected serially to the voltage source and the non-volatile memory cell, and a current absorption control transistor disposed between the non-volatile memory cell and a reference potential and connected serially to the non-volatile memory cell and the reference potential. The current supply control transistor and the current absorption control transistor are operated in a current saturation area denoted by the current-voltage characteristic, thereby controlling a current that flows in the non-volatile memory cell at data writing.

DETAILED DESCRIPTION OF THE INVENTION

Hereunder, an example of the present invention will be described in detail with reference to the accompanying drawings.

Figure 1:
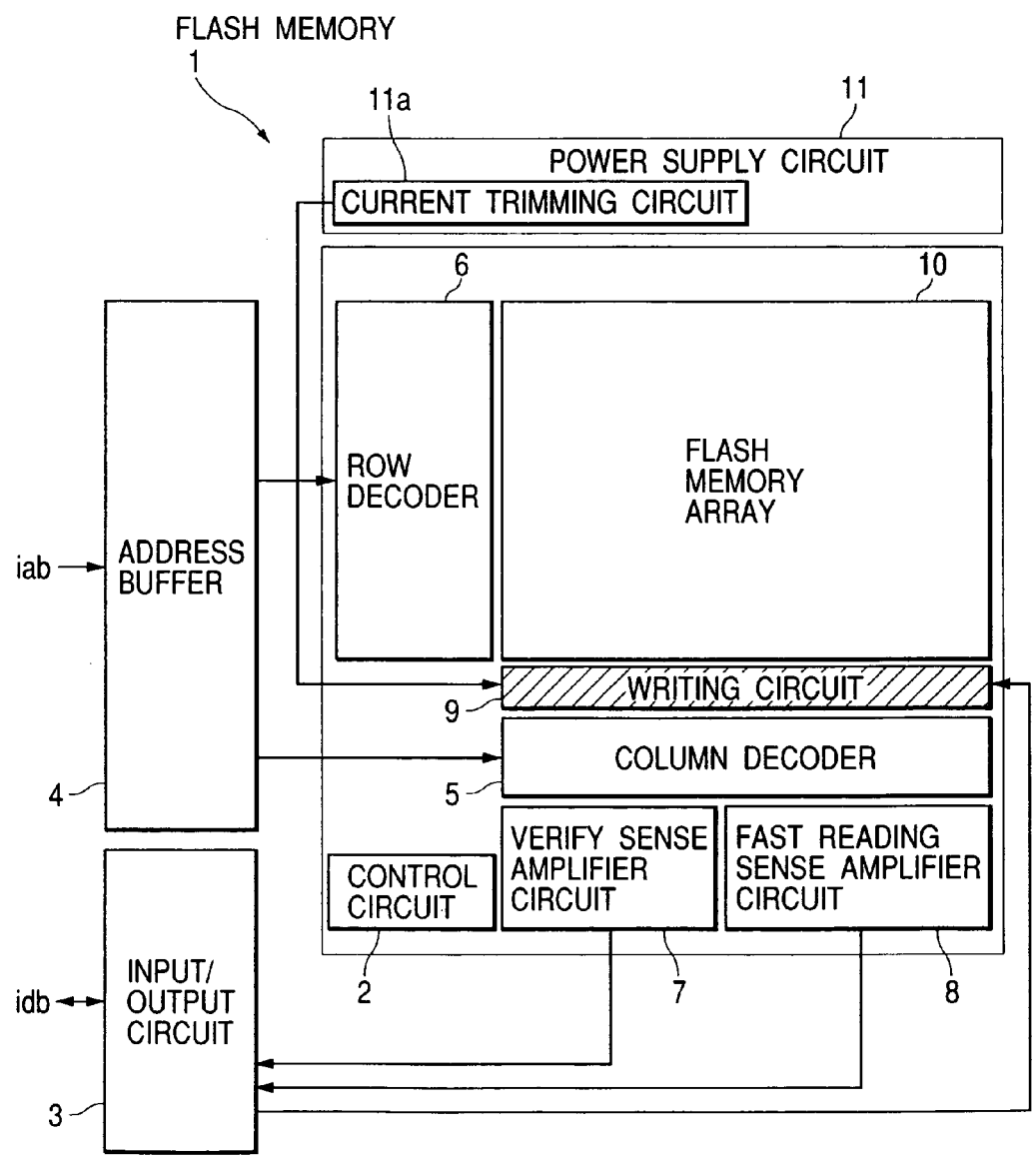
FIG. 1 is a block diagram of a flash memory in an example of the present invention.
Figure 2:
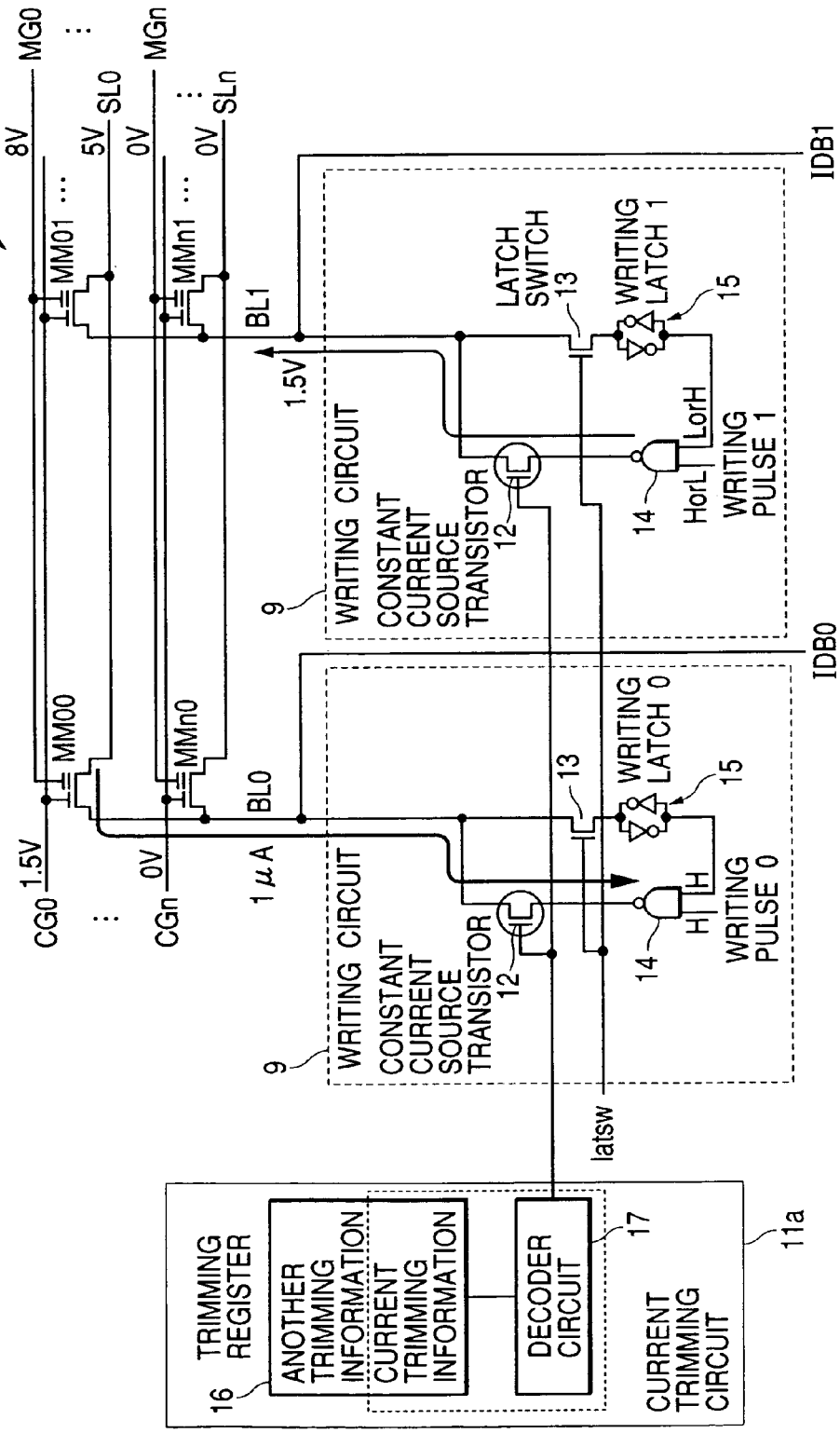
FIG. 2 is a block diagram of a writing circuit, a current trimming circuit, and a flash memory array provided in the flash memory shown in FIG. 1.
Figure 3A:
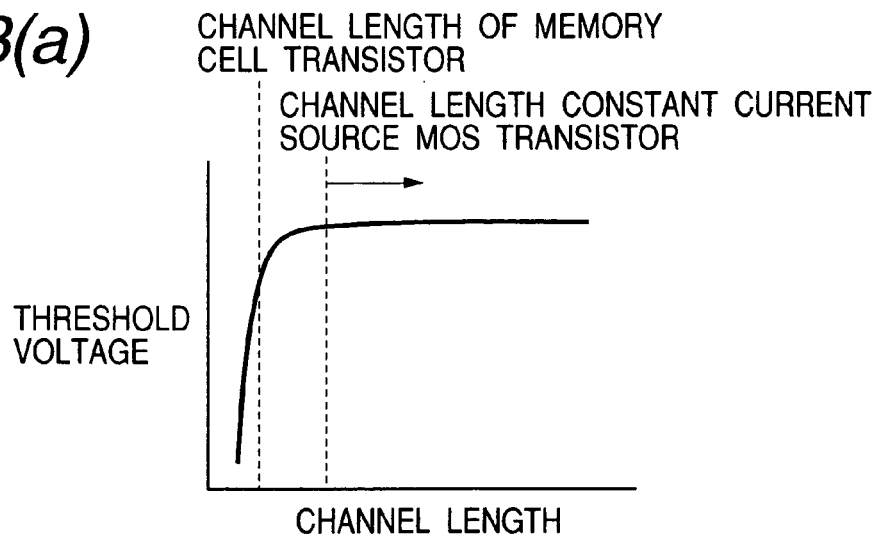
FIGS. 3A to 3C are graphs for describing the electrical characteristics of a constant current source transistor provided in the writing circuit shown in FIG. 2.
Figure 3B:
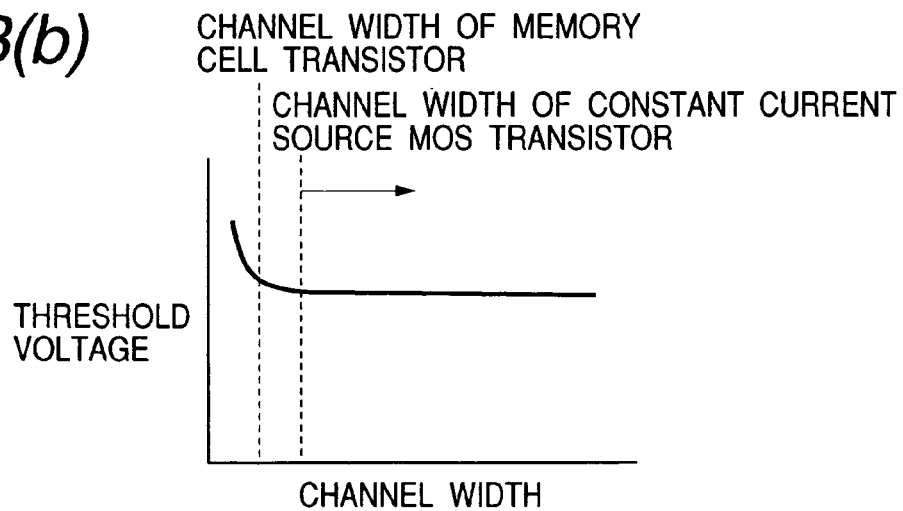
Figure 3C:
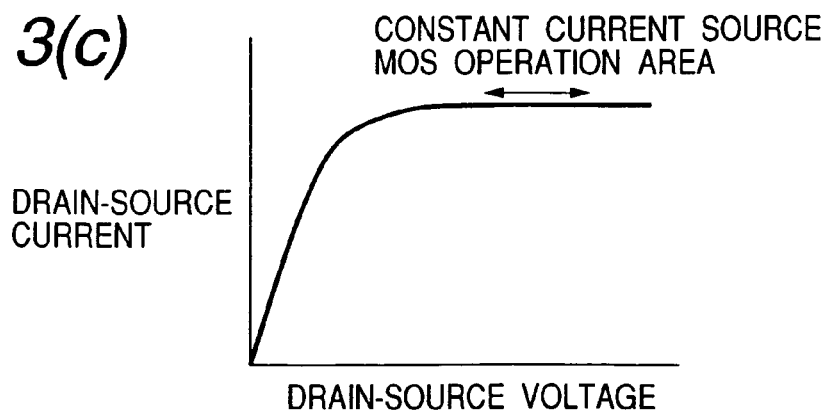
Figure 4A:
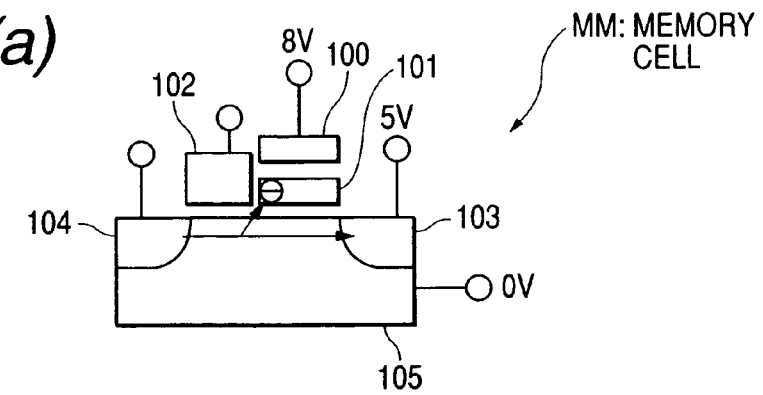
FIGS. 4A to 4C are illustrations for describing writing, erasing, and reading operations of a flash memory cell provided in the flash memory shown in FIG. 1.
Figure 4B:
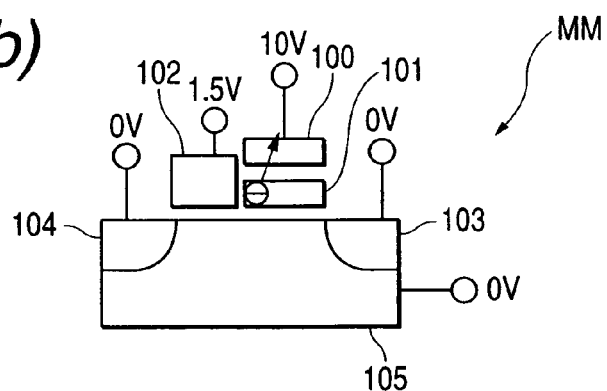
Figure 4C:
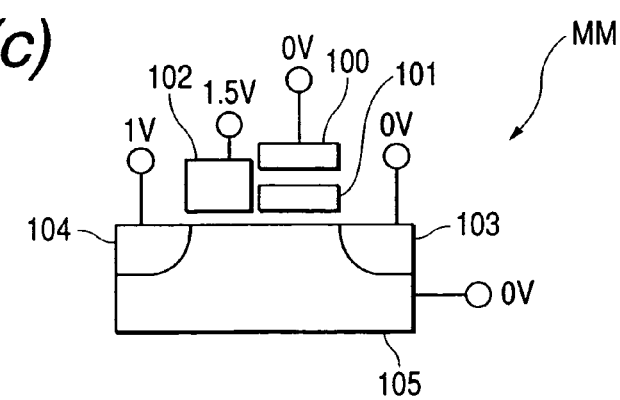
Figure 5:
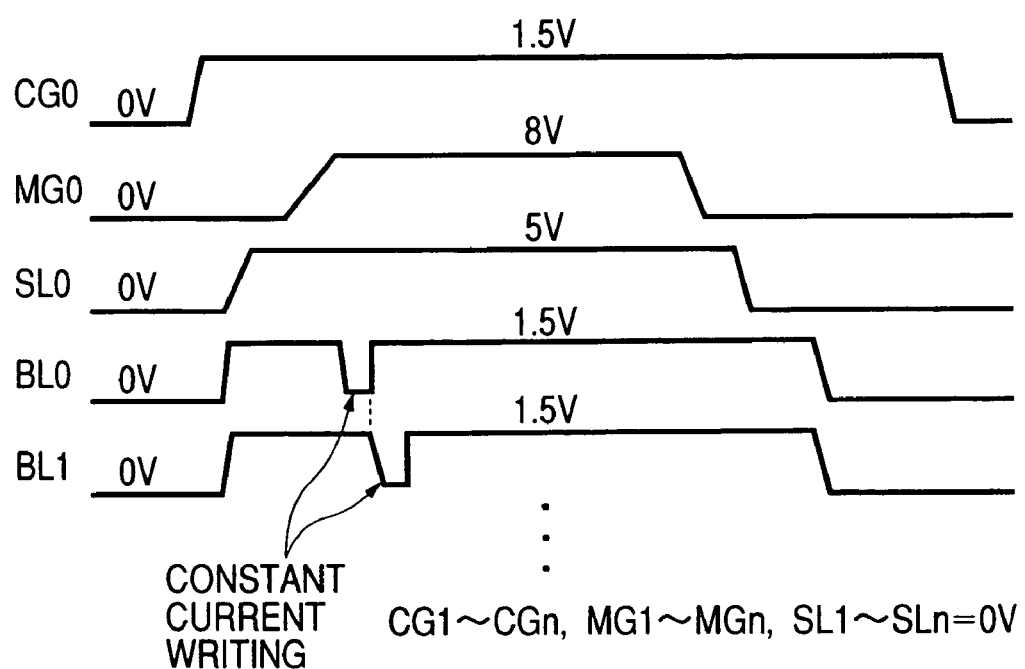
FIG. 5 is a timing chart of a writing operation in the flash memory shown in FIG. 1.
Figure 6:
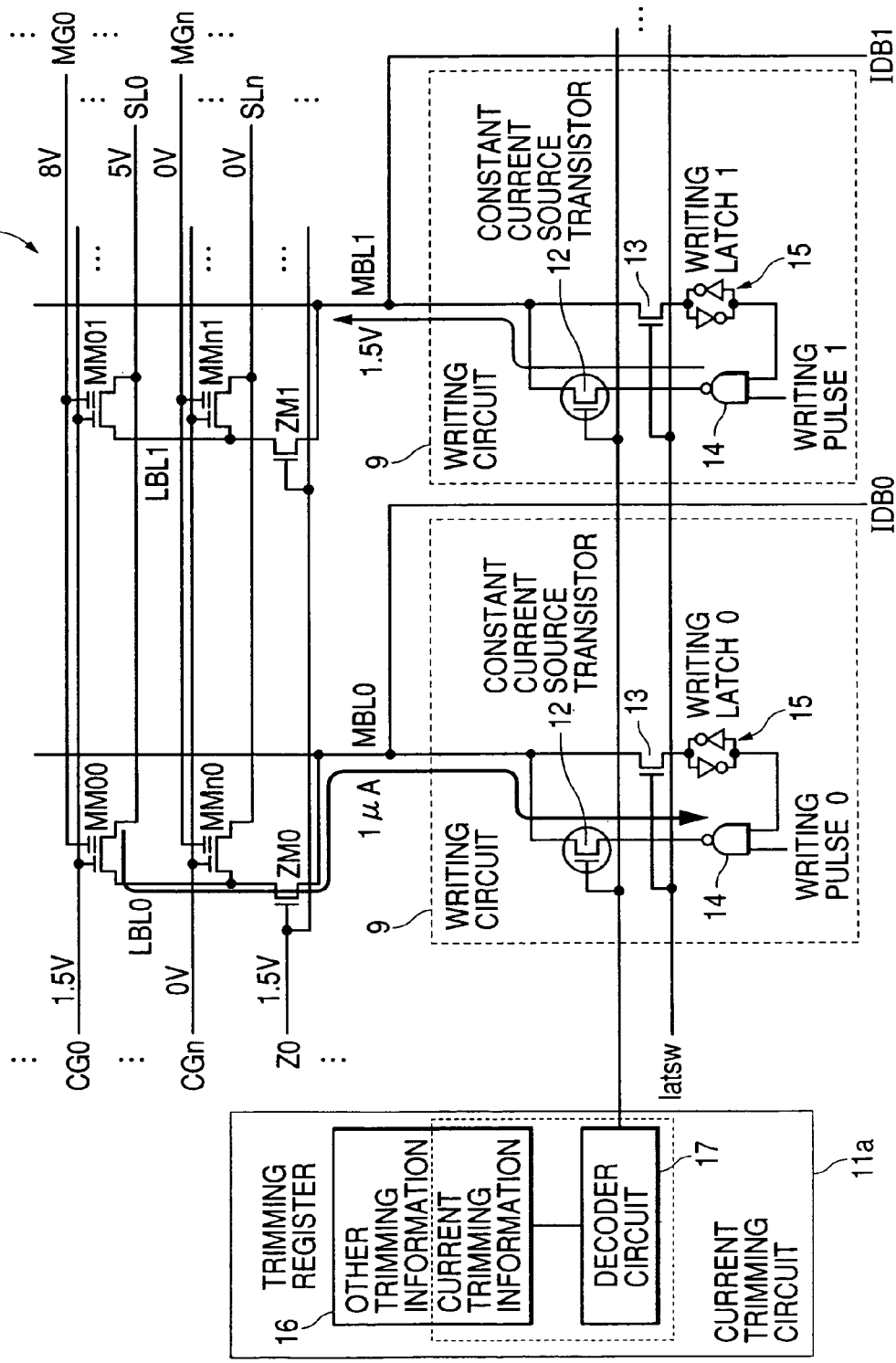
FIG. 6 is a hierarchical structure of a flash memory array provided in the flash memory shown in FIG. 1.
Figure 7:
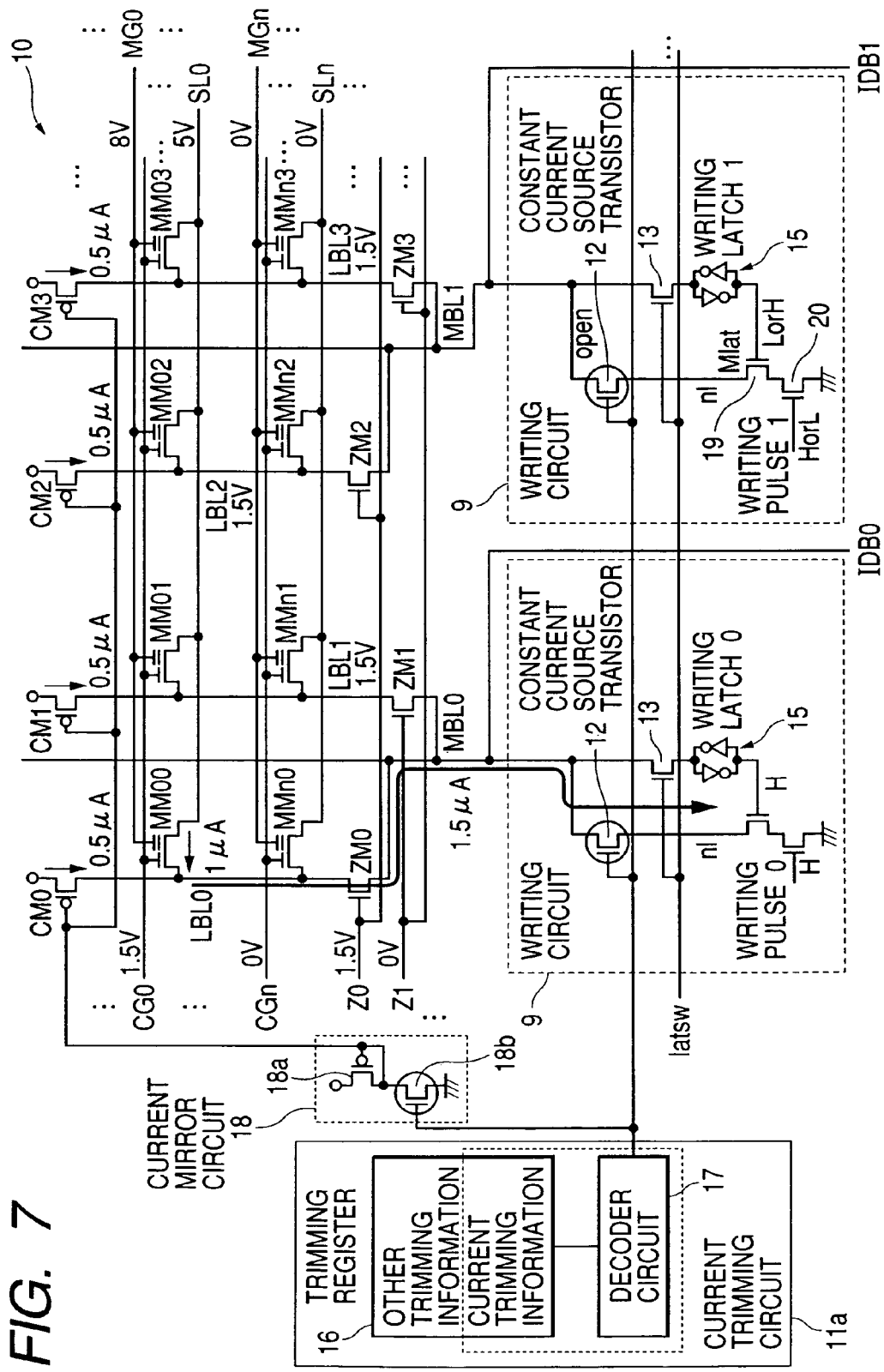
FIG. 7 is another hierarchical structure of the flash memory array provided in the flash memory shown in FIG. 1.
Figure 8:
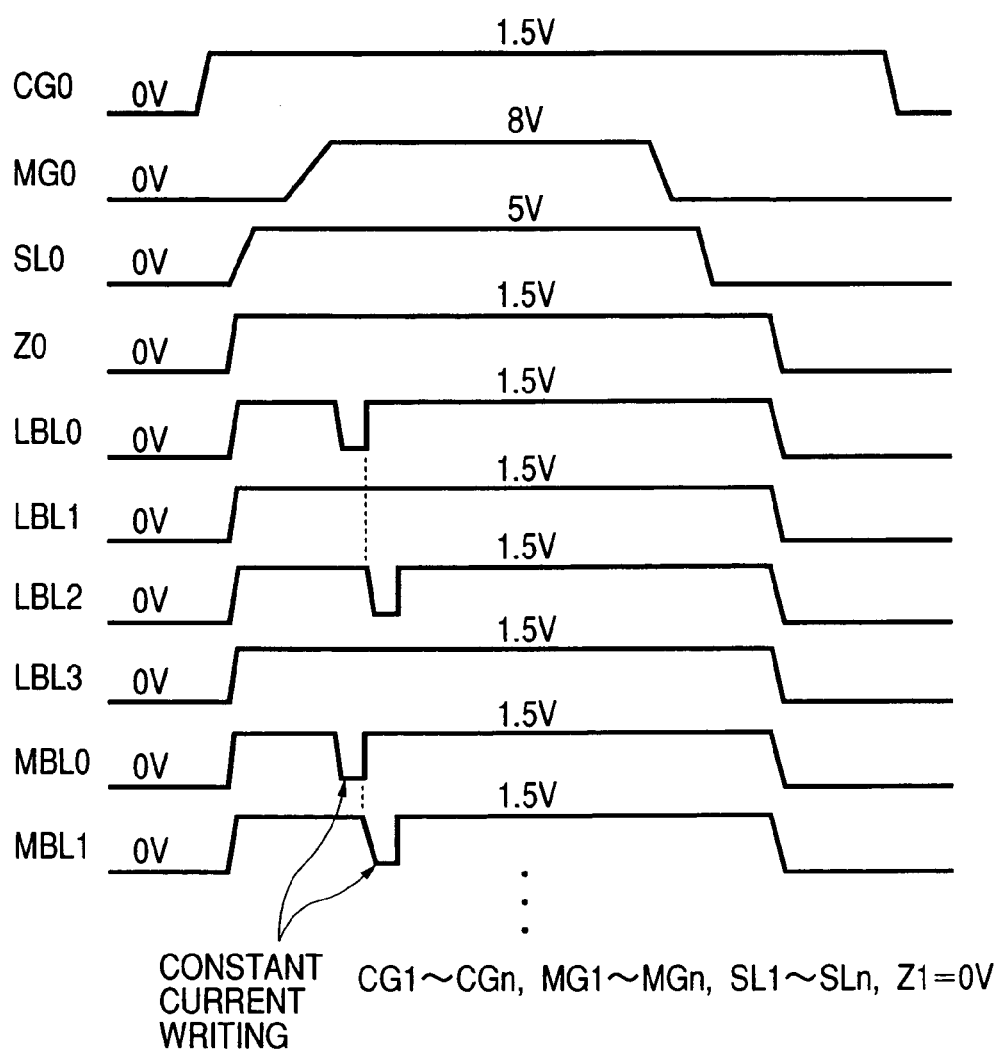
FIG. 8 is a timing chart of data writing in a memory cell provided in the flash memory array shown in FIG. 7.
Figure 9:
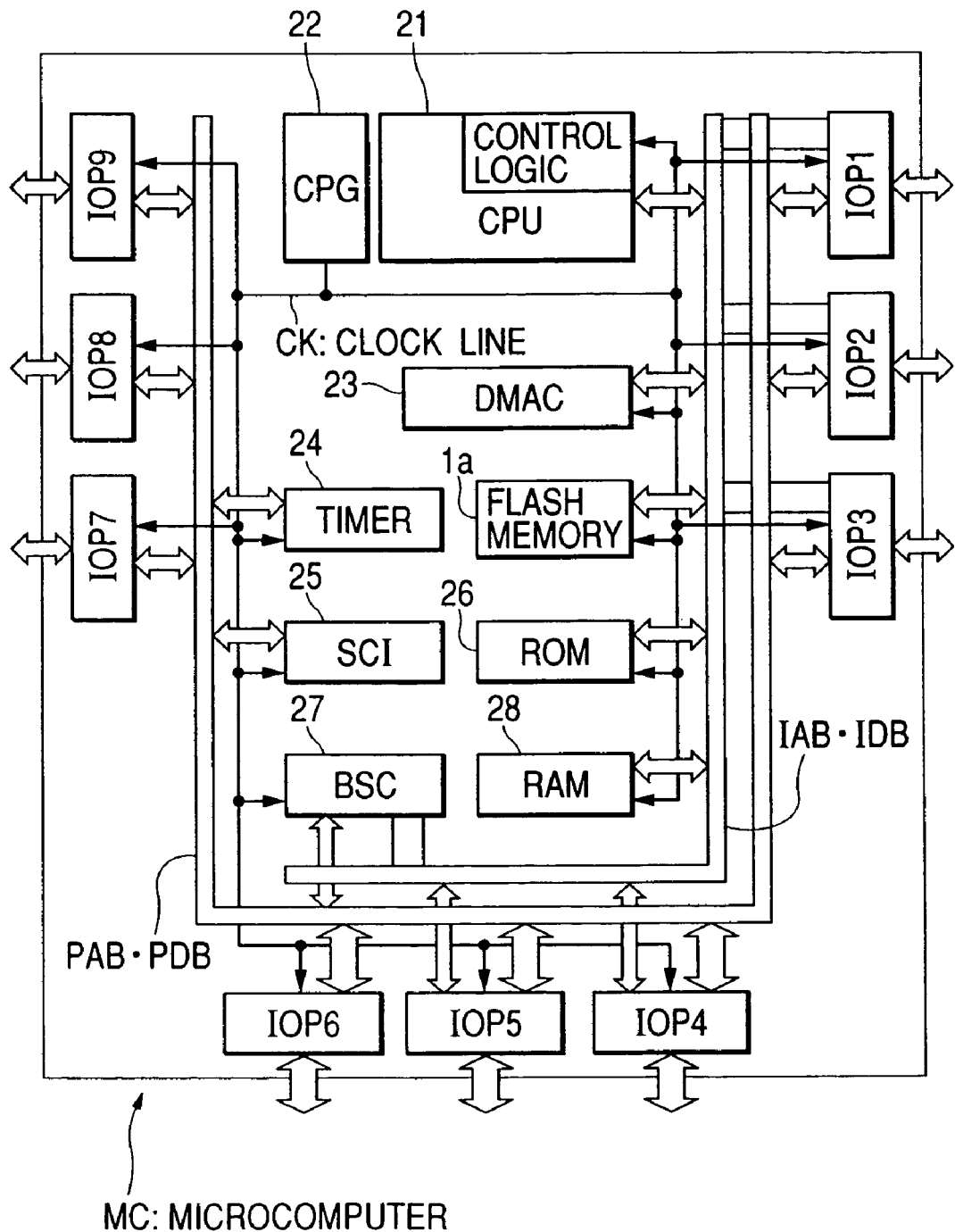
FIG. 9 is a block diagram of a single chip microcomputer built in a flash memory in the example of the present invention.

FIG. 1 is a block diagram of a flash memory in an example of the present invention. FIG. 2 is a block diagram of a writing circuit, a current trimming circuit, and a flash memory array provided in the flash memory shown in FIG. 1. FIGS. 3A to 3C are graphs for describing the electrical characteristics of a constant current source transistor provided in the writing circuit shown in FIG. 2. FIGS. 4A to 4C are illustrations for describing writing, erasing, and reading operations of a memory cell provided in the flash memory shown in FIG. 1. FIG. 5 is a timing chart of the writing operation in the flash memory shown in FIG. 1. FIG. 6 is an illustration for describing a hierarchical structure of a flash memory array provided in the flash memory shown in FIG. 1. FIG. 7 is an illustration for describing another hierarchical structure of the flash memory arrays provided in the flash memory shown in FIG. 1. FIG. 8 is a timing chart of data writing in a memory cell provided in a flash memory array shown in FIG. 7. FIG. 9 is a block diagram of a single chip microcomputer having a flash memory in itself in the example of the present invention.

In this example, a flash memory (non-volatile semiconductor memory device) 1, as shown in FIG. 1, comprises a control circuit 2, an input/output circuit 3, an address buffer 4, a column decoder 5, a row decoder 6, a verify sense amplifier circuit 7, a fast reading sense amplifier circuit 8, a writing circuit 9, a flash memory array 10, a power supply circuit 11, etc.

The control circuit 2 stores control signals inputted from such a host system as a connected microcomputer temporarily to control the operation logic. The input/output circuit 3 inputs/outputs various types of data such as data read/to be written from/in the flash memory array 10, as well as program data, etc. The address buffer 4 stores addresses inputted from external temporarily.

The address buffer 4 is connected to the column decoder 5 and the row decoder 6 respectively. The column address decoder 5 decodes each data output from the address buffer 4 according to a column address while the row address decoder 6 decodes each data output from the address buffer 4 according to a row address.

The verify sense amplifier circuit 7 verifies data in erasing/writing operations and the fast reading sense amplifier circuit 8 is a sense amplifier used at data writing. The writing circuit 9 latches write data inputted through the input/output circuit 3 to control data writing.

The flash memory array 10 includes memory cells disposed in arrays regularly. A memory cell is the minimum unit for storing data. The memory cells provided in this flash memory array 10 enables data to be erased/written therefrom/therein electrically. They use no power for storing data.

The power supply circuit 11 is configured by a voltage generation circuit for generating various voltages used for writing, erasing, and verifying data, a current trimming circuit (trimming part) for generating a given voltage to be supplied to the writing circuit 9, etc.

Next, configurations of the writing circuit 9 and the current trimming circuit 11a will be described with reference to FIG. 2. The writing circuit 9 is connected to each of bit lines BL0 to BLn. In this example, a description is made for the configuration of the writing circuit 9 connected to the bit lines BL0 to BLn. However, the same configuration is also assumed for each writing circuit 9 connected to other bit lines BL1 to BLn.

The writing circuit 9 is configured by a constant current source transistor (current absorption control transistor) 12, a latch switch 13, a NAND-circuit 14, and a writing latch 15. The constant current source transistor 12 and the latch switch 13 are, for example, N-channel MOS (Metal Oxide Semiconductor) transistors.

A bit line BL0 is connected to one of the connection parts of each of the constant current source transistor 12 and the latch switch 13. This bit line BL0 is connected to memory cells (non-volatile memory cells) MM00 to MMn0 respectively.

Both control gate 102 (FIGS. 4A to 4C) and memory gate 100 (FIGS. 4A to 4C) of each of the memory cells MM00 to MMn0 are connected in common through the selector gate line CG0 and the memory gate line MG0 while the sources 103 (FIGS. 4A to 4C) are connected in common through the source line SL0.

The gate of the constant current source transistor 12 is connected to the current trimming circuit 11a and the other connection part of the constant current source transistor 12 is connected to the output part of the NAND-circuit 14. The constant current source transistor 12 is a constant current source for fixing the writing current.

A latch switch signal is inputted to the latch switch 13 and the other connection part of the latch switch 13 is connected to the input part of the writing latch 15.

The latch switch 13 is turned on only upon an input of write data. Otherwise, it is turned off to protect write data. The writing switch 15 is a circuit for storing write data.

The output part of the writing latch 15 is connected to the other input part of the NAND-circuit 14 and a writing pulse is inputted to one of the input parts of the NAND-circuit 14.

Next, the constant current source transistor 12 will be described.

FIG. 3A is a graph for describing the dependency of the threshold voltage of the constant current source transistor 12 on the channel length. In this graph, the vertical axis denotes the threshold voltage of the constant current source transistor 12 and the horizontal axis denotes the channel length.

The channel length of the constant current source transistor 12 is, for example, twice or more longer than that of the selector gate of the memory cell and the variation of the threshold voltage is less than that of the channel length.

FIG. 3B is a graph for describing the dependency of the threshold voltage of the constant current source transistor 12 on the channel width. In this graph, the vertical axis denotes the threshold voltage of the constant current source transistor 12 and the horizontal axis denotes the channel width.

The channel width of the constant current source transistor 12 is, for example, twice or more wider than that of the selector gate of the memory cell and the variation of the threshold voltage is less than that of the channel width.

Furthermore, FIG. 3C shows a graph for describing the dependency of the drain-source current on the drain-source voltage. In FIG. 3C, the vertical axis denotes the drain-source current while the horizontal axis denotes the drain-source voltage.

As shown in FIG. 3C, in the operation area of the constant current source transistor 12, the variation of the drain-source current is less than that of the drain-source voltage.

The current trimming circuit 11a is configured by a trimming register (trimming information storage part) 16 and a decoder circuit 17. The current trimming information stored in the trimming register 16 is converted to a predetermined voltage by the decoder circuit 17 and applied to the gate of the constant current source transistor 12. The trimming register 16 stores not only the current trimming information, but also other trimming information.

Next, a configuration of a memory cell MM, as well as writing/erasing/reading of data in/from the memory cell MM will be described with reference to FIGS. 4A to 4C.

As shown in FIGS. 4A to 4C, the memory cell MM is configured by two transistors that are a selector MOS transistor and a charge storage MOS transistor. The memory cell MM has a diffusion layer provided with a source 103 and a drain 104.

A charge storage layer 101 and a memory gate 100 are formed so as to be stacked on a semiconductor substrate 105 between the source 103 and the drain 104 with a gate oxide film therebetween. Next to the charge storage layer 101 and the memory gate 100 is formed a selector gate 102. The charge storage layer 101 includes a nitride film, a floating gate, etc.

When data is to be written in this memory cell MM, as shown in FIGS. 4A to 4C, a voltage of about 8V is applied to the memory gate 100, a voltage of about 5V is applied to the source 103, and a voltage of about 0V is applied to the semiconductor substrate 105 while a voltage is applied to the selector gate 102 and the drain 104 so that a current of about 1 ìA flows between the drain 104 and the source 103. At this time, source side injection occurs and electrons are accumulated in the charge storage layer 101. This is why the memory cell current is reduced at data reading.

To erase data from the memory cell MM, as shown in FIG. 4B, for example, a voltage of about 10V is applied to the memory gate 100, a voltage of about 1.5V is applied to the selector gate 102, and a voltage of about 1.5V is applied to the source 103, the drain 104, and the semiconductor substrate 105 respectively. Then, the electrons accumulated in the charge storage layer 101 are discharged to the memory gate 100 and the current in the memory cell MM increases at reading operation.

Though a voltage of about 8V is applied to the memory gate 100 in FIG. 4B, the voltage may be varied.

To read data from the memory cell MM, as shown in FIG. 4C, for example, a voltage of about 1.5V is applied to the selector gate 102, a voltage of about 1.0V is applied to the drain 104, and a voltage of about 0V is applied to the memory gate 100, the source 103, and the semiconductor substrate 105 respectively, then the current value of the memory cell MM is determined in a sense amplifier.

Even in FIG. 4C, while a voltage of about 0V is applied to the memory gate 100, the voltage may be varied.

Next, the function of the flash memory 1 in this example will be described.

At first, a description will be made for the operation of the writing circuit 9 when data is to be written in the memory cell MM00.

At first, for example, a voltage of about 8V is applied to the memory gate line MG0, a voltage of 5V is applied to the source line SL0, and a voltage of about 1.5V is applied to the selector gate line CG0 respectively.

At this time, in the writing circuit 9, the writing pulse is 0 and the writing latch 15 outputs a High signal, and the NAND-circuit 14 outputs a Low signal. At that time, when a constant current of about 1 iA is flown in the constant current source transistor 12, the bit line BL0 is discharged by a constant current of about 1 iA to flow a current in the memory cell MM00.

Although a voltage of about 8V is applied to the memory gate and a voltage of about 5V is applied to the source, and a voltage of about 1.5V is applied to the selector gate in the memory cell MM01 in which no data is written yet at that time, the writing pulse is 1 or the writing latch 15 outputs a Low signal and the NAND-circuit 14 outputs a High signal in the writing circuit 9 connected to the memory cell MM01.

When the High signal voltage is set at about 1.5V at that time, the writing circuit 9 supplies a voltage of about 1.5V to the bot line BL1, so that the selector MOS transistor of the memory cell MM01 is not turned on. No data is this written in the memory cell MM01.

In the memory cells MMn0 and MMn1 in which no data is written yet, no voltage is applied to any of the source 103 and the selector gate 102. No data is thus written in those memory cells MMn0 and MMn1.

In the present invention, the selector gate voltage of each memory cell is not used to control the writing current. Instead, the writing current is controlled by connecting a constant current source of the constant current source transistor 12 to the object bit line. The memory cells applicable to the present invention are not only those shown in FIGS. 4A to 4C; any memory cells are applicable if they are connected in parallel to bit lines.

Next, how data is to be written in the flash memory 1 will be described with reference to the timing chart shown in FIG. 5.

In FIG. 5, signal timings are shown from top to bottom in the order of the selector gate line VG0, the memory gate line MG0, the source line SL0, and the bit lines BL0 and BL1.

For example, if data is to be written in the memory cell MM00, at first, a voltage of about 1.5V is applied to the selector gate line CG0. After that, a voltage of about 5V is applied to the source line SL0 and a voltage of about 1.5V is applied to the bit lines BL0 and BL1, then a voltage of about 8V is applied to the memory gate line respectively.

The reason why a voltage of about 1.5V is applied to the bit lines BL0 and BL1 before a voltage of about 8V is applied to the memory gate line MG0 is to prevent writing disturbance that might occur before the writing condition is set.

If the voltages of the selector gate line CG0, the source line SL0, and the memory gate line MG0 satisfy the writing condition, those lines are connected to the constant current source only for an optimized writing time in the writing circuit 9. Then, the bit line BL0 is discharged by a constant current to flow a current in the memory cell MM00.

In FIG. 2, no data is written in the memory cell MM01. When data is written in the memory cell MM01, however, as shown in FIG. 5, the memory cell MM01 is connected to the constant current source only for an optimized writing time in the writing circuit 9, so that the bit line BL1 is discharged by the constant current to make a current flow in the memory cell MM01. In other words, the writing pulse is applied to the bit lines BL sequentially only for an optimized writing time.

The voltage is fixed at 0V for the selector gate line CGn, the source line SLn, and the memory gate line Gn connected to the memory cells MMn0 and MMn1 respectively.

The operation timings of the writing circuit 9 are not limited only to those shown in FIG. 5; for example, the writing circuit 9 of the memory cell MM00 and the writing circuit 9 of the memory cell MM01 may be operated simultaneously to discharge the bit lines BL0 and BL1 with use of a constant current.

FIG. 6 shows a hierarchical structure of the flash memory array 10 provided in the flash memory 1. The circuit diagrams of the writing circuit 9 and the current trimming circuit 11a in this case are the same as those shown in FIG. 2. The description for them will thus be omitted here.

The memory cells MM are disposed regularly in arrays and the selector gate 102, the memory gate 100, and the source 103 of each of the memory cells MM are connected in common through the selector gate line CG0 to CGn, the memory gate lines MG0 to MGn, and the source lines SL0 to SLn.

The drains 104 of the memory cells MM are connected in common through the sub bit line LBL and connected to the main bit line MBL through a hierarchical MOS transistor ZM.

This main bit line MBL is connected to each writing circuit 9 and the gate of the hierarchical MOS transistor ZM is connected to a hierarchical gate line Z0.

When data is to be written in the memory cell MM00, for example, a voltage of about 8V is applied to the memory gate line MG0, a voltage of about 5V is applied to the source line SL0, and a voltage of about 1.5V is applied to the selector gate line CG0 and the hierarchical gate line Z0 respectively. In the writing circuit 9, the writing pulse is 0, the writing latch 15 outputs a High signal, and the NAND-circuit 14 outputs a Low signal.

At that time, for example, a current of about 1 iA flows in the constant current source transistor 12 and the main bit line MBL0 is discharged by a constant current of about 1 iA, thereby a current is flown in the memory cell MM00.

In the memory cell MM01 in which no data is written at that time, a voltage of about 8V is applied to the memory gate 100, a voltage of about 5V is applied to the source 103, and a voltage of about 1.5V is applied to the selector gate. In the writing circuit 9 of the memory cell MM01, however, the writing pulse is 1 or the writing latch 15 outputs a Low signal and the NAND-circuit 14 outputs a High signal.

When the High signal voltage is, for example, 1.5V, the writing circuit 9 supplies about 1.5V to the main bit line MBL1 and the selector MOS transistor of the memory cell MM01 is not turned on. No data is thus written in the memory cell MM01.

Because no voltage is applied to any of the memory gate 100, the source 103, and the selector gate 102 of each of the memory cells MMn0 and MMn1 in each of which no data is written, no data is to be written in those memory cells MMn0 and MMn1.

The data writing timing chart of the flash memory array configured as shown in FIG. 6 is almost the same as that of the flash memory shown in FIG. 5. And, the timing for applying 1.5V to the hierarchical gate line Z is the same as the timing for applying 5V to the source line SL0 and 1.5V to the bit lines BL0 and BL1, since the timing also charges 1.5V in the sub bit line LBL.

FIG. 7 shows another hierarchical structure of the flash memory array 10 provided in the flash memory 1.

The memory cells MM (FIGS. 4A to 4C) are disposed regularly in arrays and the selector gate 102, the memory gate 100, and the source 103 of each of the memory cells MM are connected in common through the selector gate lines CG0 to CGn, the memory gate lines MG0 to MGn, and the source lines SL0 to SLn.

The drains 104 of the memory cells MM are connected in common through the sub bit line LBL and connected to the main bit line MBL through a hierarchical layer MOS transistors ZM0 and ZM1 respectively.

The sub-bit line LBL is connected to a voltage source through a charge transistor (current supply control transistor) CM and the gate of the charge transistor CM is connected to a current mirror circuit 18. The current mirror circuit 18 generates a current according to the trimming information of the decoder circuit 17 and enables the charge transistor CM to be used as a constant current source.

The current mirror circuit 18 is configured by two transistors 18a and 18b connected serially between a voltage source and a reference potential and also connected serially to the voltage source and the reference potential. The transistor 18a is a P-channel MOS transistor while the transistor 18b is an N-channel MOS transistor.

Because the constant current source transistor 12 is an N-channel MOS transistor, current trimming information is used for NMOS transistors. However, because the charge transistor CM is a P-channel MOS transistor, the current trimming information is converted by the current mirror 18 so as to be used for PMOS transistors.

The gate of the charge transistor CM is connected to the gate of the transistor 18a and the connection parts of the transistors 18a and 18b respectively. The gate of the transistor 18B is connected to the decoder circuit 17 provided in the current trimming circuit 11a.

The main bit line MBL is connected to two sub-bit lines LBL in parallel through the hierarchical MOS transistors ZM0 and ZM1. The bit line MBL is connected to the writing circuit 9. Although two sub-bit lines LBL are connected to the main bit line MBL in parallel here, more sub-bit lines may be connected in parallel.

Gate signals Z0 and Z1 are inputted to the gates of the hierarchical MOS transistors ZM0 and ZM1 respectively.

Furthermore, the writing circuit 9 configured by a constant current source transistor 12, a latch switch 13, and a writing latch 15 as shown in FIG. 2 is newly provided with transistors 19 and 20 here. The circuit diagram of the current trimming circuit 11a is the same as that shown in FIG. 2. The description will thus be omitted here.

The transistors 19 and 20 are N-channel MOS transistors. One of the connection parts of the transistor 19 is connected to the other connection part of the constant current source transistor 12.

The other connection part of the transistor 19 is connected to one of the connection parts of the transistor 20 and the other connection part of the transistor 20 is connected to the reference potential (VSS).

The gate of the transistor 19 is connected to the output part of the writing latch 15 and the transistor 19 is turned on/off according to the data stored in the writing latch 15. The writing pulse is inputted to the gate of the transistor 20 and the transistor 20 is turned on/off according to the writing pulse.

To write data in the memory cell MM00, for example, a voltage of about 8V is applied to the memory gate line MG0, a voltage of about 5V is applied to the source line SL0, and a voltage of about 1.5V is applied to the selector gate line CG0 and the hierarchical MOS gate line Z0 respectively.

In the writing circuit 9, the writing pulse is 0, the writing latch outputs a High signal, the transistors 19 and 20 are turned on, and the wiring n1 outputs a Low signal.

At that time, for example, a constant current of about 1 ìA flows in the constant current source transistor 12 and the main bit line MBL0 is discharged by a constant current of about 1 ìA, thereby a current is flown in the memory cell MM00.

And, a voltage of about 8V is applied to the memory gate 100, a voltage of about 5V is applied to the source 103, and a voltage of about 1.5V is applied to the selector gate 102 of the memory cell MM01 in which no data is written.

And, because the main bit line MBL0 is connected to a constant current source, the hierarchical MOS transistor ZM1 must be turned off. At that time, the sub-bit line LBL1 is opened, so that a writing disturbance occurs in the memory cell MM01.

To prevent such a disturbance, the charge transistor CM1 is connected to the sub-bit line LBL1. The CM1 is used to charge the sub-bit line LBL1 to, for example, 1.5V. Similarly, a charge transistor CM is connected to another sub-bit line LBL. The charge transistor CM is, for example, a P-channel MOS transistor.

A charge transistor CM is just required to charge a sub-bit line LBL. Therefore, about 0.5 ìA will be enough as the required current of the transistor CM. The charge transistor should be a constant current source if manufacturing variation and temperature characteristic are taken into consideration.

Although about 1.5V is applied to the bit line BL from the writing circuit 9 to suppress data writing in FIG. 2, the memory array configured as shown in FIG. 7 is not required to output about 1.5V in the writing circuit 9, since the charge transistor CM charges the sub-bit line to about 1.5V.

In the writing circuit 9, therefore, when the writing pulse is 1 or the writing latch 15 outputs a Low signal, the transistor 19 or 20 is turned off, thereby the wiring n1 opens. Consequently, the writing circuit 9 opens the main bit line MBL1.

The memory array configured as shown in FIG. 7 may also have a function for outputting about 1.5V in the writing circuit 9, of course. At that time, no voltage is applied to any of the memory gate 100, the source 103, and the selector gate 102 of each of the memory cells MMn0 to MMn3 in each of which no data is written. No data is thus written in any of those memory cells MMn0 to MMn3.

In the memory array configured as shown in FIG. 7, gates of the charge transistors CM are connected in common. Consequently, a charging current of about 0.5 ìA always flows in those transistors CM at writing. To reduce the writing current to 1 ìA or so, the discharging current of the connected constant current source (constant current source transistor 12) in the writing circuit 9 is required to be set at about 1.5 iA, which is a sum of the writing current and the charge transistor current.

Furthermore, although the gates of the charge transistors CM are connected in common in the above memory array configuration, those gates may not be connected in common and each of the gates may be selected for each address independently.

In FIG. 7, an N-channel MOS transistor is used as the constant current source transistor 12 and a P-channel MOS transistor is used as the charge transistor CM. Other type transistors may also be used as the transistors 12 and CM.

Furthermore, although the current trimming circuit 11a is used to assume the charge transistor CM as a current source, another method may also be employed for that purpose. And, a NAND-circuit may be provided instead of the transistor 19/20.

Next, how data is to be written in the memory cell MM00 shown in FIG. 7 will be described with reference to the timing chart shown in FIG. 8.

In FIG. 8, signal timings are shown from top to bottom in the order of the selector gate CG0, the memory gate line MG0, the source line SL0, the hierarchical MOS gate line Z0, the sub-bit lines LBL0 to LBL3, and the main bit lines MBL0 and MBL1.

At first, a voltage of about 1.5V is applied to the selector gate line CG0. Then, a voltage of about 5V is applied to the source line SL0, a voltage of about 1.5V is applied to the hierarchical MOS gate line, and the charge transistor CM is turned on to apply a voltage of about 1.5V to the sub-bit lines LBL0 to LBL3 respectively. After that, a voltage of about 8V is applied to the memory gate line MG0.

The reason why about 1.5V is applied to the sub-bit lines LBL0 to LBL3 before about 8V is applied to the memory gate line MG0 is to prevent writing disturbance that might occur before the writing condition is set.

When the voltages applied to the selector gate line CG0, the source line SL0, and the memory gate line MG0 satisfy the writing condition, the main bit line MBL0 is connected to the constant current source only for an optimized time in the writing circuit 9, thereby the main bit line BL0 is discharged by the constant current and a current is flown in the memory cell MM00.

In FIG. 7, no data is written in the memory cell MM02. If data is to be written in the memory cell MM02, however, the main bit line MBL1 is connected to the constant current source only for an optimized time in the writing circuit after data is written in the memory cell MM00 as shown in FIG. 8 and the main bit line MBL1 is discharged by the constant current, thereby a current is flown in the memory cell MM02. In other words, the writing pulse is applied to the main bit lines MBL sequentially only an optimized time.

At this time, the voltage is fixed at 0V in the selector gate line CGn, the source line SLn, and the memory gate MGn connected to the memory cells MMn0 to MMn3 in any of which no data is written.

There is no need to limit the operation timing of the writing circuit 9 only to that one shown in FIG. 8; for example, the writing circuits 9 of the memory cells MM00 and MM02 may be operated simultaneously to discharge the main bit lines MBL0 and MBL1 with use of a constant current.

FIG. 9 shows a block diagram of a single chip microcomputer (semiconductor integrated circuit device) MC provided in a flash memory, which is an example of the semiconductor integrated circuit device of the present invention.

This microcomputer MC is a system LSI provided with an on-chip flash memory (non-volatile memory part) configured similarly to the flash memory. 1 (FIG. 1). The microcomputer MC further includes a CPU (central processing unit) 21, a CPG 22, a DMAC 23, a timer 24, an SCI 25, a ROM 26, a BSC 27, a RAM 28, input/output ports IOP1 to IOP9, etc.

The CPU 21 controls the whole microcomputer MC according to the programs, etc. stored in the ROM 26.

The ROM (Read Only Memory) 26 stores programs and fixed data to be executed by the CPU 21. The RAM (Random Access Memory) 28 stores operation results of the CPU 21 and supplies a working area to the CPU 21.

The DMAC (Direct Memory Access Controller) 23 controls transfer of data block by block between the ROM 26/RAM 28 and an external main memory connected thereto.

The SCI (Serial Communication Interface) 25 enables serial communication with external devices. The timer 24 counts a set time and sets a flag and/or issues an interrupt when the set time is reached.

The CPG (Clock Pulse Generator) 22 generates a clock signal of a frequency and supplies a system clock used as an operation clock to an object. The input/output ports IOP1 to IOP9 are input/output terminals used to connect the microcomputer to external.

The microcomputer MC is connected to each of the CPU 21, the flash memory 1a, the ROM 26, the RAM 28, the DMAC, and the input/output ports IOP1 to IOP5 through a main address bus IAB and a main data bus IDP.

The microcomputer MC is also connected to such peripheral devices as the timer 24, the SCI 125, etc., as well as the input/output ports IOP1 to IOP9 through a peripheral address bus PAB and a peripheral data bus PDB.

The BSC 27 controls signal transfer between the main address bus IAB/main data bus IDB and the peripheral address bus PAB/peripheral data bus PDB and controls the state of each of those buses.

According to the example described above, therefore, because the constant current source transistor 12 is used to supply a constant current used for data writing, it is possible to reduce the variation of the threshold voltage of each memory cell MM significantly, as well as the power consumption at writing.

Furthermore, because the current consumption is reduced as described above, the number of memory cells MM in which data can be written simultaneously increases, thereby the writing in the flash memory 1/1a is speeded up significantly.

Furthermore, in the example of the present invention described above, the flash memory array 10 provided in the flash memory 1 is configured as shown in FIGS. 2, 6, and 7. However, the configuration of the flash memory array 10 may be modified freely.

Figure 10:
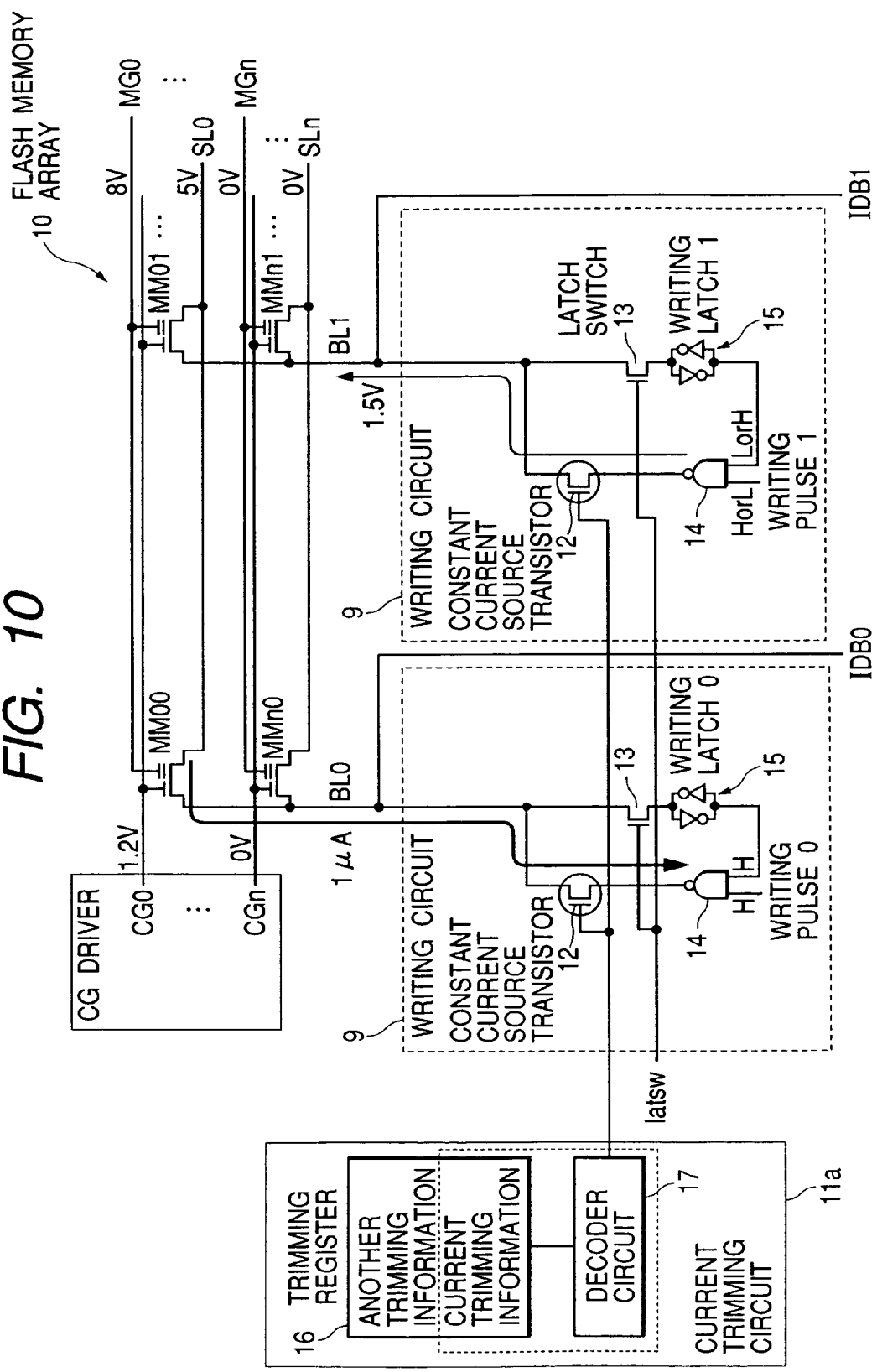
FIG. 10 is a block diagram of another example of the writing circuit, the current trimming circuit, and the flash memory array provided in the flash memory shown in FIG. 1.
Figure 11:
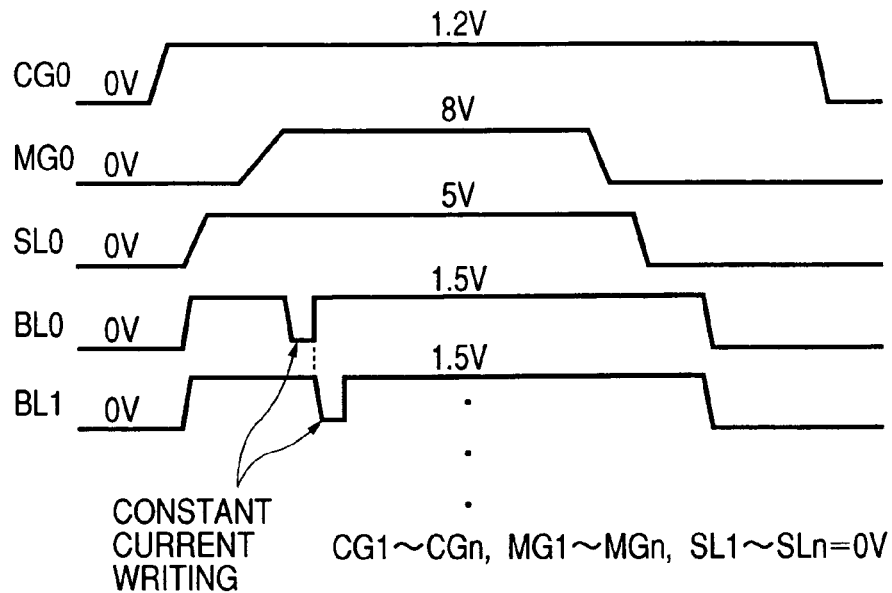
FIG. 11 is a timing chart of the writing operation performed in the flash memory shown in FIG. 10.

FIG. 10 shows another block diagram of the flash memory array shown in FIG. 2 and FIG. 11 shows a timing chart of the operation of the memory array. In FIG. 10, a voltage of 1.2V is applied to the selector gate line CG0 connected to the selector gate 102 of each of the memory cells MM00 and MMn0 to cause higher field concentration to occur between the selector gate 102 and the memory gate 100 than the configuration shown in FIG. 2.

Because 1.5V is applied to the selector gate line CG, the saturation voltage level goes lower relatively in threshold voltage change than when 1.2V is applied to the memory gate 100, thereby the stress against the insulation film of the memory gate 100 is reduced relatively at erasing or writing. The number of rewriting times is thus reduced relatively.

On the other hand, because 1.2V is applied to the selector gate line CG such way, the saturation voltage level becomes higher in the threshold voltage change of the memory gate 100, the data retaining characteristics can be improved.

Figure 12:
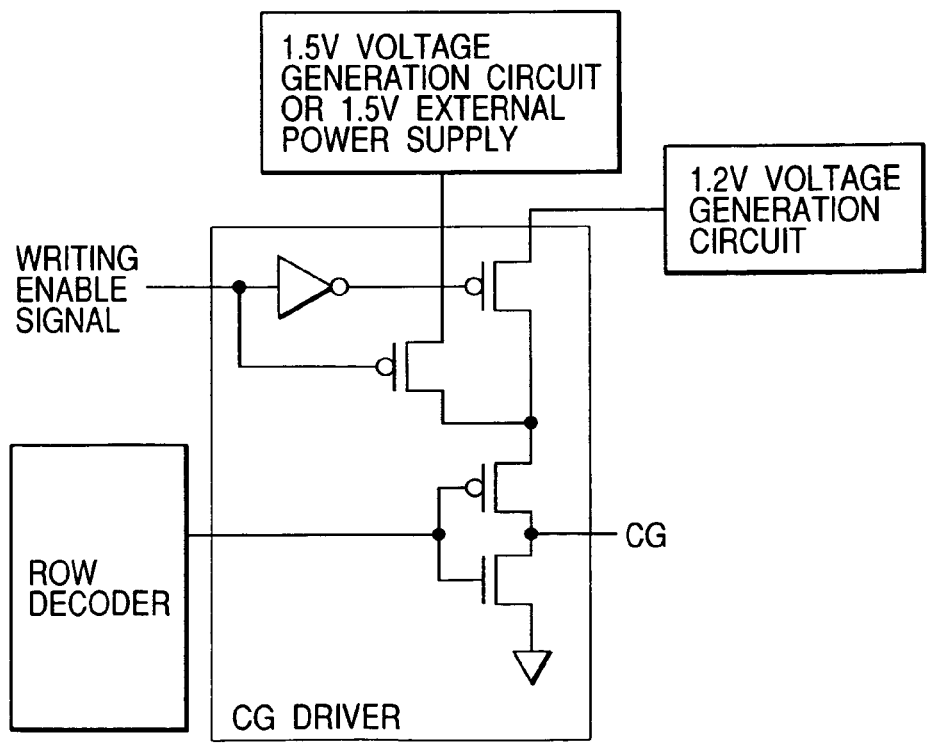
FIG. 12 is a block diagram of a CG driver provided in the flash memory array shown in FIG. 10.

In the CG driver shown in FIG. 12, the voltage applied to the selector gate line CG can be selected from 1.5V and 1.2V.

Usually, 1.5V should be applied to the selector gate line CG. To improve the data retaining characteristics more, 1.2V can be selected. The voltage is selected such way by giving consideration to the relationship between the number of rewriting times and the data retaining characteristics.

Which voltage of 1.5V and 1.2V should be applied to the selector gate line CG may be determined freely. The selection may be done by an external command or value set in a predetermined register.

While the preferred form of the present invention has been described concretely, it is to be understood the modifications will be apparent to those skilled in the art without departing from the spirit of the invention.

For example, while a current trimming circuit is used to generate a voltage to be supplied to a constant current source transistor in the above example, any other circuit may be employed if it can be used as a constant current source.

Next, typical effects of the present invention disclosed in this specification will be described briefly.

(1) The current flowing in an object non-volatile memory cell is controlled to write data therein, thereby the variation of the threshold voltage of the non-volatile memory cell is reduced significantly.

(2) According to the effect in (1), the writing current consumption is reduced, thereby the power supply circuit, etc. are reduced in size and writing operation is speeded up more.

(3) Furthermore, according to the effects in (1) and (2), the non-volatile semiconductor memory device, as well as the semiconductor integrated circuit device that employs the memory device are reduced in size and improved in performance.

What is claimed is:

1. A non-volatile semiconductor memory device comprising: a current supply control transistor disposed between a voltage source and a non-volatile memory cell and connected serially to said voltage source and said non-volatile memory cell; and a current absorption control transistor disposed between said non-volatile memory cell and a reference potential and connected serially to said non-volatile memory cell and said reference potential, wherein both of said current supply control transistor and said current absorption control transistor are operated in a current saturation area denoted by current-voltage characteristics, thereby controlling a current that flows in said non-volatile memory cell at data writing.

2. The non-volatile semiconductor memory device according to claim 1, wherein a difference between a current that flows in said current supply control transistor and a current that flows in said current absorption control transistor is used as a writing current for said non-volatile memory cell.

3. The non-volatile semiconductor memory device according to claim 1, further comprising:

a trimming part that includes a trimming information storage part for storing current trimming information and a decoder circuit for decoding said current trimming information stored in said trimming information storage part to output a voltage, wherein said trimming part generates a voltage to be applied to a gate of each of said current supply control transistor and said current absorption control transistor based on said current trimming information.

4. The non-volatile semiconductor memory device according to claim 1, further comprising:

a trimming part that includes a trimming information storage part for storing current trimming information, and a decoder circuit for decoding said current trimming information stored in said trimming storage part to output a voltage, wherein said trimming part generates a voltage to be applied to a gate of either said current supply control transistor or said current absorption control transistor based on said current trimming information.

5. The non-volatile semiconductor memory device according to claim 4, wherein said trimming information storage part stores trimming information related to a power supply circuit.

6. The non-volatile semiconductor memory device according to claim 1, wherein said non-volatile memory cell includes two transistors, each having a selector gate and a memory gate.

7. The non-volatile semiconductor memory device according to claim 6, wherein a gate of said current supply control transistor and a gate of said current absorption control transistor are longer than each said selector gate of said non-volatile memory cell.

8. A semiconductor integrated circuit device including a non-volatile storage part and a central processing unit, wherein said central processing unit executes a predetermined process and instructs said non-volatile storage part to make an operation, and said non-volatile storage part includes a plurality of non-volatile memory cells for storing information, wherein said non-volatile storage part includes a current supply control transistor disposed between a voltage source and a non-volatile memory cell and connected serially to said voltage source and said non-volatile memory cell, and a current absorption control transistor disposed between said non-volatile memory cell and a reference potential and connected serially to said non-volatile memory cell and said reference potential, and wherein said current supply control transistor and said current absorption control transistor are operated in a current saturation area denoted by current-voltage characteristics, thereby controlling a current that flows in said non-volatile memory cell at data writing.

9. The semiconductor integrated circuit device according to claim 8, wherein a difference between a current that flows in said current supply control transistor and a current that flows in said current absorption control transistor is used as a writing current for said non-volatile memory cell.

10. The semiconductor integrated circuit device according to claim 8, further comprising:

a trimming part that includes a trimming information storage part for storing current trimming information, and a decoder circuit for decoding said current trimming information stored in said trimming information storage part to output a voltage, wherein said trimming part generates a voltage to be applied to a gate of each of said current supply control transistor and said current absorption control transistor according to said current trimming information.

11. The semiconductor integrated circuit device according to claim 8, further comprising:
   a trimming part that includes a trimming information storage part for storing current trimming information, and a decoder circuit for decoding said current trimming information stored in said trimming information storage part to output a voltage,
   wherein said trimming part generates a voltage to be applied to a gate of either said current supply control transistor or said current absorption control transistor according to said current trimming information.

12. The semiconductor integrated circuit device according to claim 11,
   wherein said trimming information storage part stores trimming information related to said power supply circuit.

13. The semiconductor integrated circuit device according to claim 8,
   wherein said non-volatile memory cell includes two transistors, each having a selector gate and a memory gate.

14. The semiconductor integrated circuit device according to claim 13,
   wherein a gate of said current supply control transistor and a gate of said current absorption control transistor are longer than each said selector gate of said non-volatile memory cell.

15. A non-volatile semiconductor memory device including at least one of a current supply control transistor disposed between a voltage source and a non-volatile memory cell and connected serially to said voltage source and said non-volatile memory cell, and a current absorption control transistor disposed between said non-volatile memory cell and a reference potential and connected serially to said non-volatile memory cell and said reference potential,
   wherein said non-volatile memory cell includes a control transistor and a memory transistor having a charge storage area, and applies a first voltage to the control gate of said control transistor and a second voltage to the control gate of said memory transistor, and
   wherein said at least one of said current supply control transistor and said current absorption control transistor is operated in a current saturation area denoted by current-voltage characteristics, thereby controlling a current that flows in said non-volatile memory cell at data writing, and selectively applying either a third voltage lower than said second voltage or a fourth voltage lower than said third voltage to the control gate of said control transistor as said first voltage selectively.

16. The non-volatile semiconductor memory device according to claim 15, further including a circuit for generating said first voltage to be applied to the control gate of said control transistor,
   wherein said circuit outputs either said third voltage or said fourth voltage as said first voltage.

17. The non-volatile semiconductor memory device according to claim 16, further including a register for storing information used to determine which of said third voltage and said fourth voltage is output as said first voltage.

18. The non-volatile semiconductor memory device according to claim 16,
   wherein in said circuit, the determination of which of said third voltage and said fourth voltage is output as said first voltage is made according to an instruction that includes information used for such output voltage determination.

* * * * *